(12) United States Patent
Miyagi

(10) Patent No.: US 7,378,709 B2
(45) Date of Patent: May 27, 2008

(54) OSCILLATOR WITH A GUARD RING FORMED AROUND AN N WELL AND CONSTITUENT COMPONENTS INTEGRALLY FORMED ON THE N WELL, ON A SEMICONDUCTOR SUBSTRATE

(75) Inventor: Hiroshi Miyagi, Niigata (JP)

(73) Assignees: Niigata Seimitsu Co., Ltd., Niigata (JP); Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/484,648

(22) PCT Filed: Jun. 28, 2002

(86) PCT No.: PCT/JP02/06552

§ 371 (c)(1),
(2), (4) Date: Jan. 22, 2004

(87) PCT Pub. No.: WO03/010881

PCT Pub. Date: Feb. 6, 2003

(65) Prior Publication Data

US 2004/0183605 A1  Sep. 23, 2004

(30) Foreign Application Priority Data

Jul. 25, 2001  (JP) .......................... 2001-224892
Dec. 26, 2001  (JP) .......................... 2001-395235

(51) Int. Cl.
*H01L 29/00* (2006.01)
(52) U.S. Cl. .................... 257/338; 331/117 R
(58) Field of Classification Search .......... 331/117 R, 331/117 FE, 108 C; 257/338, 351
See application file for complete search history.

(56) References Cited

U.S. PATENT DOCUMENTS

| 5,396,195 | A | * | 3/1995 | Gabara ................... 331/113 R |
| 5,900,763 | A | * | 5/1999 | Rahim et al. ............. 327/292 |
| 5,994,741 | A | * | 11/1999 | Koizumi et al. ........... 257/355 |
| 6,459,134 | B2 | * | 10/2002 | Ohguro et al. ............ 257/501 |

FOREIGN PATENT DOCUMENTS

| JP | 52-74263 | 6/1977 |
| JP | 64-8704 | 1/1989 |
| JP | 3-24806 | 2/1991 |
| JP | 5-206387 | 8/1993 |
| JP | 7-202565 | 8/1995 |

(Continued)

*Primary Examiner*—Joseph Chang
(74) *Attorney, Agent, or Firm*—Patentttm.us

(57) ABSTRACT

An oscillator capable of reducing a noise component when partly formed by using the CMOS process or the MOS process. A high-frequency amplifier circuit, a mixing circuit, a local oscillator 13, intermediate-frequency filters, an intermediate-frequency amplifier circuit, a limit circuit, an FM detection circuit, and a stereo demodulation circuit which constitute an FM receiver are formed as a one-chip component. The local oscillator 13 is formed on a semiconductor substrate by using the CMOS process or the MOS process and the transistors constituting the circuit are p-channel type FETs 21, 22. Moreover, the local oscillator 13 has a resonance circuit whose one end is connected to a DC bias circuit composed of a resistor 27 and the center voltage of the oscillation is set to a value higher than 0 V.

4 Claims, 6 Drawing Sheets

FOREIGN PATENT DOCUMENTS

| | | |
|---|---|---|
| JP | 9-219458 | 8/1997 |
| JP | 11-330851 | 11/1999 |
| JP | 11-330852 | 11/1999 |
| JP | 2000-307344 | 11/2000 |
| JP | 2000-332629 | 11/2000 |
| JP | 2001-111341 | 4/2001 |
| JP | 2001-345428 | 12/2001 |

* cited by examiner

OSCILLATOR WITH A GUARD RING FORMED AROUND AN N WELL AND CONSTITUENT COMPONENTS INTEGRALLY FORMED ON THE N WELL, ON A SEMICONDUCTOR SUBSTRATE

TECHNICAL FIELD

The present invention relates to an oscillator used in receivers and the like.

BACKGROUND ART

A general receiver adopting a super-heterodyne method converts a frequency by using a frequency mixing circuit after amplifying a modulated wave signal received via an antenna at a high frequency, and demodulates it after converting it into an intermediate-frequency signal having a predetermined frequency.

Furthermore, progress has recently been made on the research of techniques of integrally forming the constituent components of a receiver on a semiconductor using a CMOS process or a MOS process. By thus molding various circuits on one chip using the CMOS process or MOS process, it is possible to reduce the size and cost of the whole device. Accordingly, the range of circuits molded on one chip is expected to be increased in the future.

With respect to an output from an oscillator, focus will be on its frequency components. As shown in FIG. 10, noise side bands appear at the opposite sides of an ideal output spectrum with a frequency $f_0$. The noise side bands are composed of ideal oscillator spectrum components on which 1/f noises that are low frequency noises are superimposed and consist mainly of phase noises and frequency noises. In particular, a MOS type FET has more 1/f noises than a bipolar transistor and thus has more noise side bands appearing in the output of the oscillator. Consequently, when such an oscillator is used as a local oscillator, many noise components are superimposed on an intermediate frequency signal obtained by a frequency conversion. This reduces an SN ratio to degrade the quality of reception.

DISCLOSURE OF THE INVENTION

The present invention is created in view of this point. It is an object of the present invention to provide an oscillator capable of reducing noise components when formed by using the CMOS process or the MOS process.

To accomplish this object, the present invention provides an oscillator in which constituent components including a transistor are integrally formed on a semiconductor substrate using the CMOS process or the MOS process. This transistor is formed using a p-channel type FET. By forming the transistor included in the oscillator using a p-channel type FET, which has a lower mobility, thereby allowing the reduction of 1/f noises generated in the transistor and hence the reduction of noise sideband superimposed on the output from the oscillator.

Furthermore, an N well is formed in the above semiconductor substrate, and the constituent components are desirably formed on the N well. When all the components of a frequency mixing circuit, including the p-channel type FET, are formed on the N well, a pn joint surface is formed between the N well and the underlying semiconductor substrate. This prevents a noise current from flowing through this joint surface. Consequently, noises generated from the oscillator can be prevented from flowing into other components through the semiconductor substrate.

Moreover, in the above semiconductor substrate, a guard ring is desirably formed on the semiconductor substrate around the constituent components. This enables noises generated from the oscillator to be more effectively prevented from flowing into other components through the semiconductor substrate.

Furthermore, the guard ring is desirably formed around the above constituent components so as to extend from a surface of the semiconductor substrate down to a position deeper than the N well. By forming the guard ring so as to extend to the position deeper than the N well, it is possible to remove noises in a low frequency region flowing over the guard ring from the components formed on the N well to external components or vice versa.

Desirably, the oscillator further comprises a resonance circuit having one end grounded in an AC manner and a DC bias circuit that provides this end with a DC bias voltage. When one end of the resonance circuit is grounded, the following situation can be presented: when the potential at the other end becomes negative, a current flows to the semiconductor substrate, thus hindering an output voltage from being extracted.

BRIEF DISCLOSURE OF THE DRAWINGS

BEST MODE FOR CARRYING OUT THE INVENTION

A detailed description will be given below of a local oscillator according to an embodiment to which the present invention is applied.

Figure 1:
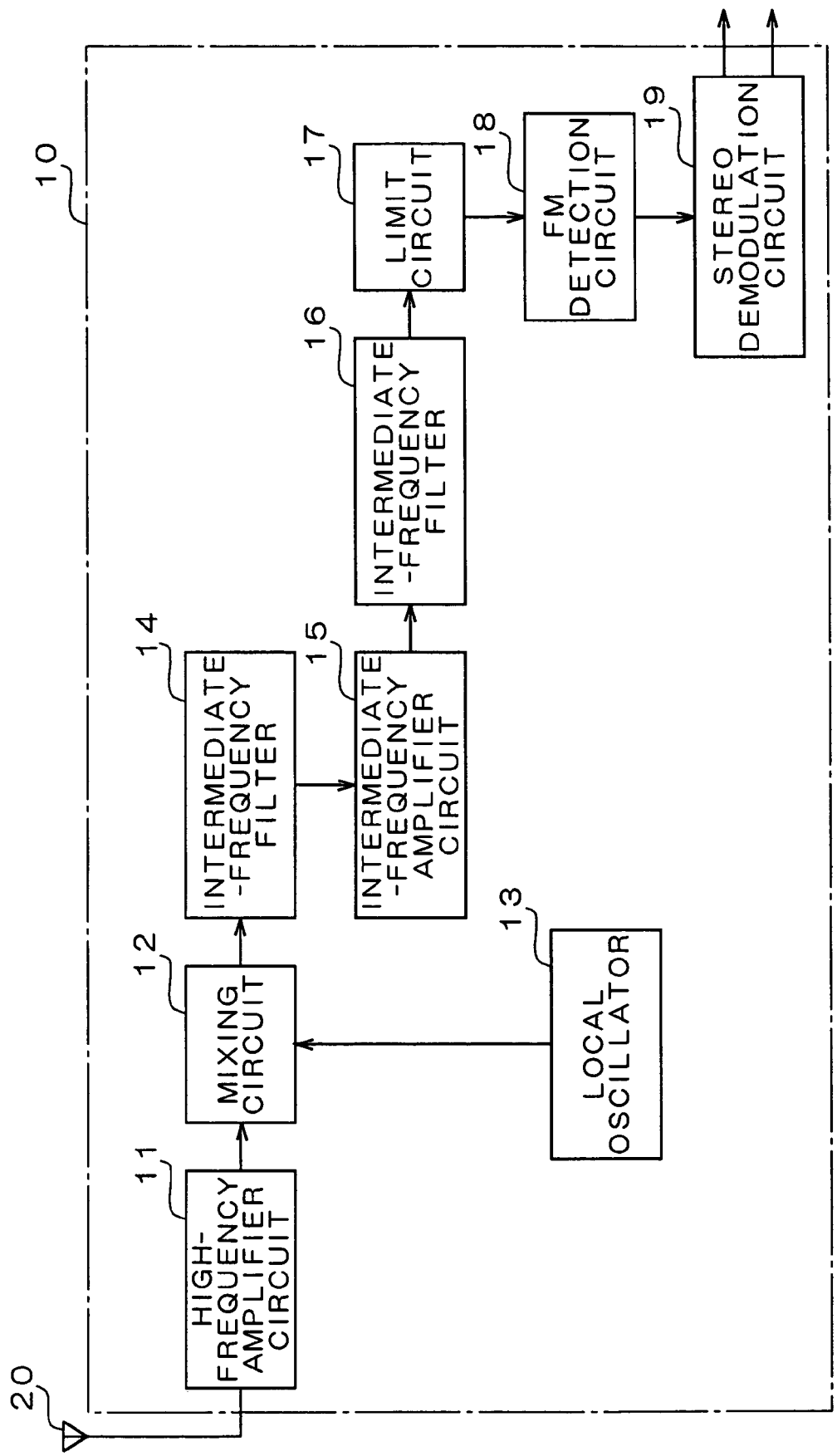
FIG. 1 is a diagram showing the configuration of an FM receiver including a local oscillator according to an embodiment.

FIG. 1 is a view showing the configuration of an FM receiver including a local oscillator according to this embodiment. The FM receiver shown in FIG. 1 includes a high frequency amplifier circuit 11, a mixing circuit 12, a local oscillator 13, intermediate frequency filters 14 and 16, an intermediate frequency amplifier circuit 15, a limit circuit 17, an FM detection circuit 18, and a stereo demodulation circuit 19 which are collectively formed as a one-chip component 10.

An FM modulated wave signal received by an antenna 20 is amplified by the high frequency amplifier circuit 11. A local oscillation signal outputted by the local oscillator 13 is mixed with the amplified signal to convert the high frequency signal into an intermediate frequency signal. The intermediate frequency filters 14 and 16 are provided in a preceding stage and a subsequent stage to the intermediate frequency amplifier circuit 15. The intermediate frequency filters 14 and 16 extract only a predetermined band component from the inputted intermediate frequency signal. The intermediate frequency amplifier circuit 15 amplifies a part of the intermediate frequency signal which passes through the intermediate frequency filters 14 and 16.

The limit circuit 17 amplifies the inputted intermediate frequency signal so as to provide a high gain. The FM detection circuit 18 executes an FM detecting process on a signal of a fixed amplitude outputted by the limit circuit 17. The stereo demodulation circuit 19 executes a stereo demodulating process on a composite signal outputted by the FM detection circuit 18, the composite signal having undergone the FM detection. The stereo demodulation circuit 19 generates an L signal and an R signal.

The above one-chip component 10 according to the present embodiment is integrally formed on a semiconductor substrate using the CMOS process or the MOS process. It is contemplated that only the circuits constituting the one-chip component 10, shown in FIG. 1, may be formed on the semiconductor substrate or that various analog or digital circuits may be formed on the semiconductor circuit. Various CMOS components can be easily formed using the CMOS process or the MOS process. For example, a frequency synthesizer, a control circuit for a display device, or the like is desirably formed on the same semiconductor substrate; the frequency synthesizer varies the oscillation frequency of the local oscillator 13 in order to set a reception frequency.

FETs formed using the CMOS process or the MOS process are characterized by generating 1/f noise (low frequency noise) that is louder than that generated by bipolar transistors. Accordingly, when the one-chip component 10 shown in FIG. 1 is formed on one chip using the CMOS process or the MOS process, the FET contained in the chip part as an amplifier element may act as a source for 1/f noise. Furthermore, the 1/f noise components are superimposed on an oscillation output spectrum from the local oscillator 13 as a noise sideband. Consequently, when such an oscillation signal and the mixing circuit 12 are used to execute a frequency conversion, the intermediate frequency signal contains many noise components. This reduces an S/N ratio to degrade the quality of reception.

Thus, in the one-chip component 10 constituting an FM receiver of this embodiment, a p-channel type FET is employed at least as an amplifier element (transistor) included in the local oscillator 13.

Figure 2:
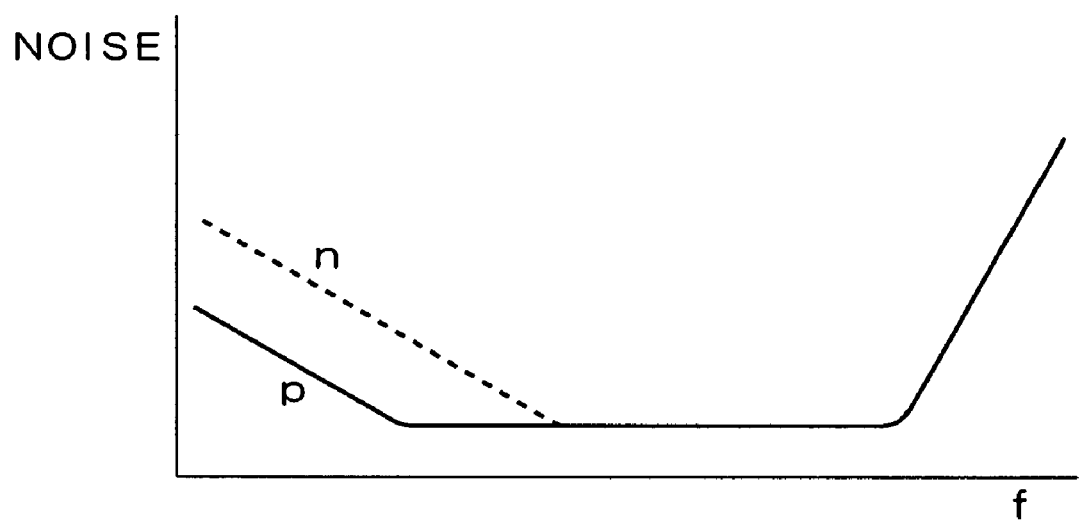
FIG. 2 is a graph showing the noise characteristic of an FET manufactured using the CMOS process or the MOS process.

FIG. 2 is a graph showing the noise characteristic of an FET manufactured using the CMOS process or the MOS process. The axis of abscissa indicates a frequency, whereas the axis of ordinate indicates a noise level. The characteristic shown by a solid line indicates the noise characteristic of a p-channel type FET. The characteristic shown by a dotted line indicates the noise characteristic of an n-channel type FET. As shown in FIG. 2, the p-channel type FET generates a lower 1/f noise appearing in a low frequency region than the n-channel type FET. This is because the p-channel type FET is expected to have a lower mobility.

Accordingly, by using a p-channel type FET as an amplifier element, it is possible to reduce 1/f noises generated by the FET included in the local oscillator 13. This makes it possible to reduce the noise side bands contained in an output spectrum from the local oscillator 13 to improve the SN ratio of the whole receiver as well as signal quality.

Figure 3:
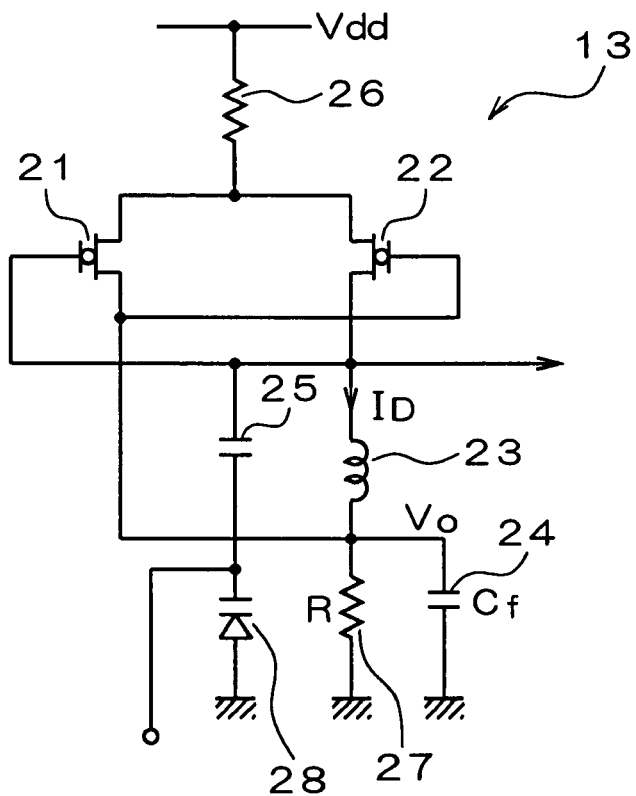
FIG. 3 is a circuit diagram showing the specific configuration of the local oscillator.

FIG. 3 is a circuit diagram showing the specific configuration of the local oscillator 13. The local oscillator 13, shown in FIG. 3, includes FETs 21 and 22, a coil 23, capacitors 24 and 25, resistors 26 and 27, and a variable capacity diode 28. The coil 23 and the variable capacity diode 28 constitute a parallel resonance circuit. The capacitor 24 is used to ground one end of this parallel resonance circuit in an AC manner. Furthermore, the resistor 27 functions as a DC bias circuit that provides this end of the parallel resonance circuit with a DC bias voltage. The capacitor 25 is used to separate DC components from a reverse bias voltage when the voltage is applied in order to vary the capacity value of the variable capacity diode 28. The two FETs 21 and 22, included in the above described arrangement, are of a p-channel type. Furthermore, all the components including the coil 23 are formed on the semiconductor substrate.

Figure 4:
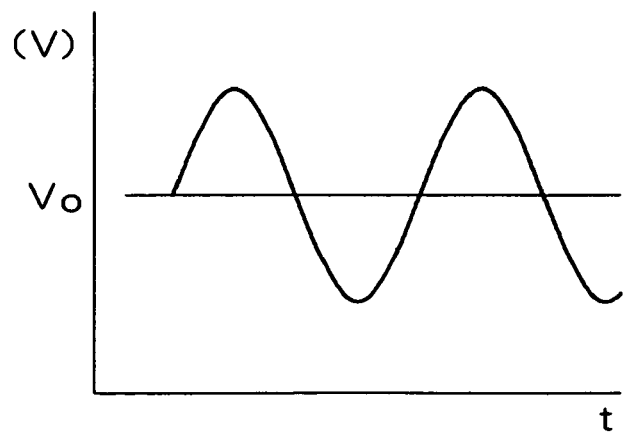
FIG. 4 is a graph showing an output waveform from the local oscillator shown in FIG. 3.

FIG. 4 is a diagram showing an output waveform from the local oscillator 13. Since the resistor 27 provides a predetermined bias voltage $V_0$, the output wave has a sinusoidal shape extending upward and downward from the bias voltage $V_0$.

Figure 5:
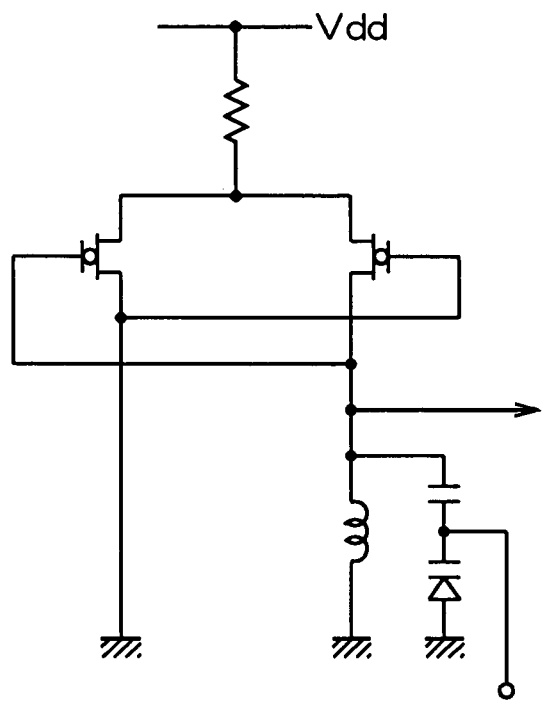
FIG. 5 is a circuit diagram showing the configuration of a local oscillator not having any DC bias circuits.
Figure 6:
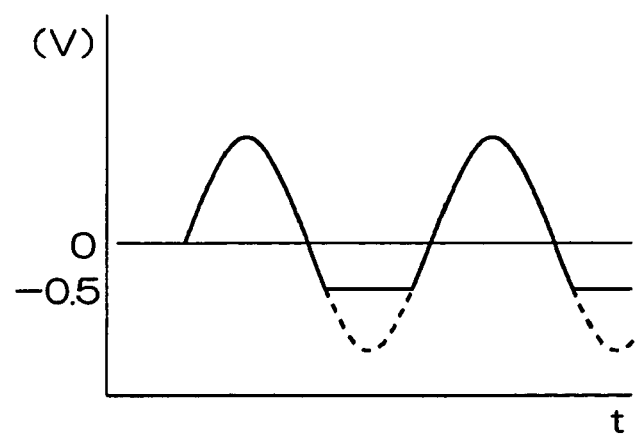
FIG. 6 is a graph showing an output waveform from the local oscillator shown in FIG. 5.

On the other hand, if the parallel resonance circuit composed of the coil and variable capacity diode has one end grounded in an AC and DC manner as shown in FIG. 5, the output wave has a sinusoidal shape extending upward and downward from 0 V as shown in FIG. 6. However, in this case, when the output voltage becomes negative, a forward current flows from a source to the semiconductor substrate (or an N well). Consequently, the output waveform is clamped at a predetermined negative potential and thus distorted. The conventional local oscillator is often composed of an n-channel type FET and does not undergo such an inconvenience. In the present embodiment, such an inconvenience, which results from the use of a p-channel type FET for reducing noise, is avoided by using an additional DC bias circuit.

Figure 7:
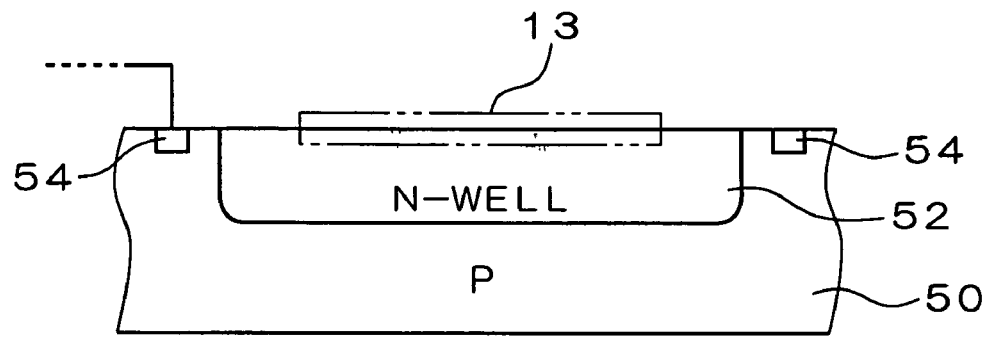
FIG. 7 is a sectional view showing a variation of the local oscillator.
Figure 8:
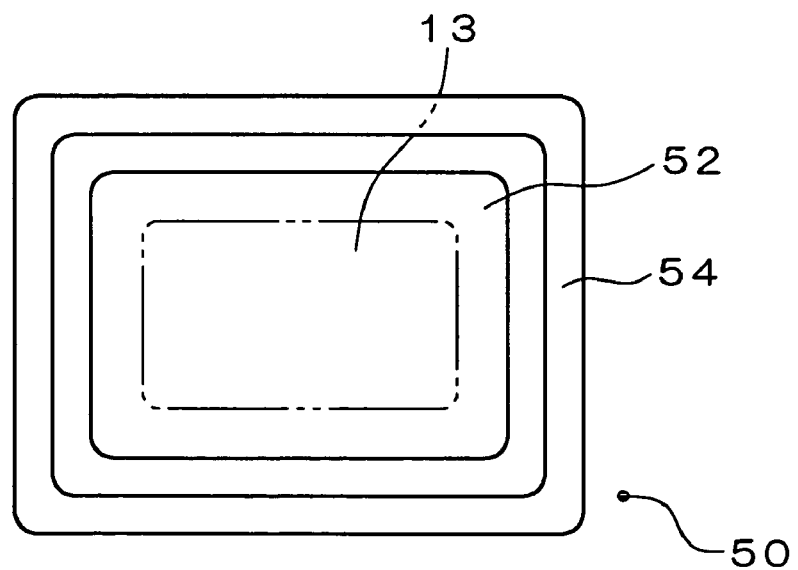
FIG. 8 is a plan view of the structure shown in FIG. 7.

FIG. 7 is a sectional view showing a variation of the local oscillator 13 according to the above described embodiment. Furthermore, FIG. 8 is a plan view showing the structure shown in FIG. 7. In the structure shown in these figures, all the components of the local oscillator 13 are formed on an N well 52. A PN joint surface is formed between the N well 52 and a P type semiconductor substrate 50. Accordingly, if the potential of the N well 52 is higher than that of the semiconductor substrate 50, a current flowing from the N well 52 to the semiconductor substrate 50 is blocked by the PN joint surface. It is thus possible to prevent noises generated from the local oscillator 13 from flowing into other circuits through the semiconductor substrate 50.

Furthermore, as shown in FIG. 8, a guard ring 54 is formed near the surface of the semiconductor substrate 50 and around the periphery of the N well 52. The guard ring 54 is composed of a part of the P type semiconductor substrate which is formed into an N type region. A combination of the guard ring 54 and semiconductor substrate 50 forms a PNP layer. It is thus possible to effectively prevent noises generated from the local oscillator 13 from flowing near the surface of the semiconductor substrate 50 into other circuits.

The present invention is not limited to the above described embodiment. Many variations may be made to the embodiment without departing from the spirits of the present invention. For example, in the above embodiment, the local oscillator included in the FM receiver has been described.

However, the present invention is applicable to local or other oscillators included in AM receivers, various receivers or transmitters in data terminal apparatuses or the like, or other electronic equipment.

Furthermore, in the above embodiment, the oscillator configured as shown in FIG. 3 has been described. However, the present invention is applicable to other oscillators comprising a resonance circuit having one end grounded. The present invention is applicable to, for example, a clapp oscillator or a Colpitts oscillator.

Moreover, in the above-described embodiment, all the components of the local oscillator 13 are formed on the semiconductor substrate. However, only some of the components constituting the resonance circuit, such as the coil 23, may be externally attached to the substrate.

Figure 9:
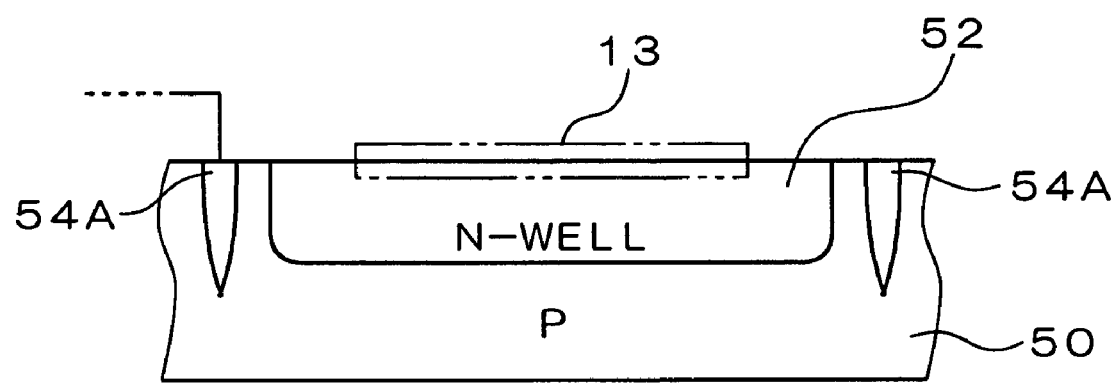
FIG. 9 is a sectional view showing a variation of a guard ring.
Figure 10:
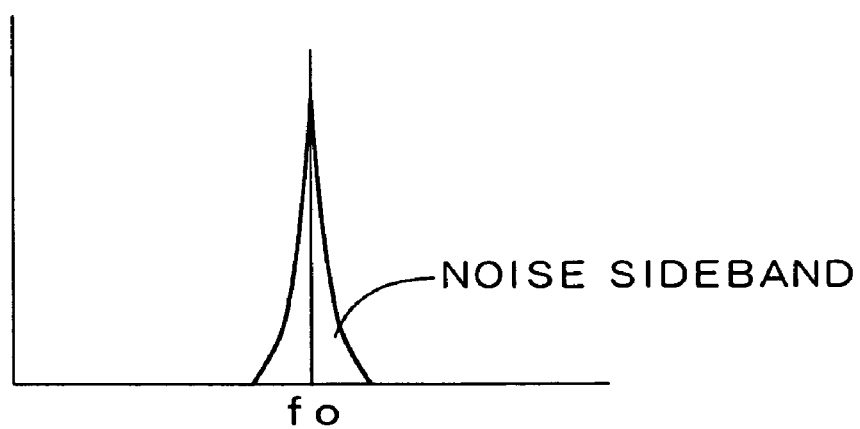
FIG. 10 is a diagram showing an output spectrum from an oscillator.

Furthermore, in the example shown in FIG. 7, the guard ring 54 is formed near the surface of the semiconductor substrate 50. However, as shown in FIG. 9, instead of the guard ring 54, a guard ring 54A may be used which is formed so as to extend from the surface of the semiconductor substrate 50 to a position deeper than the N well 52. Then, if noises generated from the local oscillator 13, formed on the N well 52, flow under the guard ring 54A (inside the semiconductor substrate 50) into other circuits, lower frequency components can be prevented from flowing into these circuits.

INDUSTRIAL APPLICABILITY

As described above, according to the present invention, by forming a transistor included in an oscillator using a p-channel type FET, which has a low mobility, it is possible to reduce 1/f noise generated from the transistor. This makes it possible to reduce noise side bands superimposed on an output from the oscillator.

The invention claimed is:

1. An oscillator in which constituent components including a transistor as amplifier element are integrally formed on a semiconductor substrate using a CMOS process or a MOS process,
   wherein said transistor is formed using a p-channel type FET,
   wherein an N well is formed in said semiconductor substrate, and said constituent components are formed on the N well, and
   wherein a guard ring is formed outside of and around said N well so as to extend from a surface of said semiconductor substrate down to a position deeper than said N well, said guard ring being formed separately from said N well.

2. The oscillator according to claim 1, having a resonance circuit having one end grounded in an AC manner and a DC bias circuit that provides this end with a DC bias voltage.

3. The oscillator according to claim 1, wherein said guard ring is formed outside of said N well.

4. The oscillator according to claim 1, wherein said semiconductor substrate is a P type semiconductor substrate and said guard ring is formed as an N type region in said semiconductor substrate, wherein the combination of said guard ring and semiconductor substrate forms a PNP layer.

* * * * *